United States Patent
Yang

(10) Patent No.: US 10,019,051 B2
(45) Date of Patent: Jul. 10, 2018

(54) OPERATION CONTROL DEVICE FOR ELECTRONIC APPARATUS

(71) Applicant: EASYSAVER CO., LTD., Incheon (KR)

(72) Inventor: Ki Chul Yang, Gyeonggi-do (KR)

(73) Assignee: EASYSAVER CO., LTD., Incheon (KR)

( * ) Notice: Subject to any disclaimer, the term of this patent is extended or adjusted under 35 U.S.C. 154(b) by 0 days.

(21) Appl. No.: 14/913,128

(22) PCT Filed: Mar. 4, 2015

(86) PCT No.: PCT/KR2015/002036
§ 371 (c)(1),
(2) Date: Feb. 19, 2016

(87) PCT Pub. No.: WO2015/147454
PCT Pub. Date: Oct. 1, 2015

(65) Prior Publication Data
US 2017/0010661 A1    Jan. 12, 2017

(30) Foreign Application Priority Data

Mar. 26, 2014 (KR) .................. 10-2014-0035360
Jun. 12, 2014 (KR) .................. 10-2014-0071146
Oct. 6, 2014 (KR) .................. 10-2014-0134355

(51) Int. Cl.
*G06F 1/32* (2006.01)
*G05B 19/042* (2006.01)
(Continued)

(52) U.S. Cl.
CPC ....... *G06F 1/3296* (2013.01); *G05B 19/0426* (2013.01); *G06F 1/32* (2013.01);
(Continued)

(58) Field of Classification Search
CPC ............ G08C 2201/12; G08C 2201/40; G08C 2201/10; G06F 1/3203; G06F 1/3296; G06F 1/3209
See application file for complete search history.

(56) References Cited

U.S. PATENT DOCUMENTS 6,690,283 B2   2/2004   Nemoto et al.
7,423,546 B1   9/2008   Aisa
(Continued)

FOREIGN PATENT DOCUMENTS

CN     202333340 U    7/2012
EP       2385352 A2   11/2011
(Continued)

OTHER PUBLICATIONS

International Search Report for PCT/KR2015/002036.
(Continued)

*Primary Examiner* — Jaweed A Abbaszadeh
*Assistant Examiner* — Alyaa T Mazyad
(74) *Attorney, Agent, or Firm* — The PL Law Group, PLLC

(57) ABSTRACT

An operation control device for an electronic apparatus is provided. An operation control device for an electronic apparatus according to an embodiment of the present disclosure, which is connected to an electronic apparatus and can transmit and receive signals to and from the electronic apparatus and a control device for remotely controlling use of power in the electronic apparatus, comprises: a measuring unit for calculating the amount of power supplied to the electronic apparatus; and a communicating unit for receiving identification information of the electronic apparatus and state information of the electronic apparatus from the electronic apparatus, transmitting information regarding the amount of power, the identification information of the
(Continued)

electronic apparatus, and the state information of the electronic apparatus to the control device, and receiving a first control signal for controlling operation of the electronic apparatus from the control device and then transmitting the first control signal to the electronic apparatus, thereby switching the electronic apparatus to an off mode or a sleep mode.

18 Claims, 9 Drawing Sheets

(51) Int. Cl.

| | |
|---|---|
| G08C 17/00 | (2006.01) |
| H01R 24/28 | (2011.01) |
| H02J 3/14 | (2006.01) |
| H02J 13/00 | (2006.01) |
| H04Q 9/00 | (2006.01) |
| G06F 9/4401 | (2018.01) |
| H01R 13/713 | (2006.01) |
| H01R 13/717 | (2006.01) |
| H02M 7/04 | (2006.01) |
| H01R 103/00 | (2006.01) |
| G01R 22/00 | (2006.01) |
| H01R 13/66 | (2006.01) |

(52) U.S. Cl.
CPC ............ *G06F 1/3209* (2013.01); *G06F 9/442* (2013.01); *G06F 9/4418* (2013.01); *G08C 17/00* (2013.01); *H01R 13/6666* (2013.01); *H01R 13/6675* (2013.01); *H01R 13/713* (2013.01); *H01R 13/717* (2013.01); *H01R 24/28* (2013.01); *H02J 3/14* (2013.01); *H02J 13/001* (2013.01); *H02M 7/04* (2013.01); *H04Q 9/00* (2013.01); *G01R 22/00* (2013.01); *G05B 2219/2613* (2013.01); *G05B 2219/2642* (2013.01); *H01R 13/665* (2013.01); *H01R 2103/00* (2013.01); *Y02B 70/3225* (2013.01); *Y02B 70/3241* (2013.01); *Y02B 90/226* (2013.01); *Y04S 20/16* (2013.01); *Y04S 20/222* (2013.01); *Y04S 20/227* (2013.01)

(56) References Cited

U.S. PATENT DOCUMENTS

| | | | |
|---|---|---|---|
| 2009/0108680 A1 | 4/2009 | Minemura | |
| 2009/0249002 A1* | 10/2009 | Imahara | G05B 15/02 |
| | | | 711/161 |
| 2010/0148591 A1 | 6/2010 | Lim | |
| 2011/0006615 A1* | 1/2011 | Kim | H01R 13/665 |
| | | | 307/131 |
| 2012/0300860 A1 | 11/2012 | Washiro | |
| 2012/0326514 A1* | 12/2012 | Kim | H02J 9/005 |
| | | | 307/66 |
| 2013/0060393 A1 | 3/2013 | Somasundaram et al. | |
| 2013/0322846 A1* | 12/2013 | Ferren | G06K 9/3266 |
| | | | 386/234 |
| 2014/0056033 A1* | 2/2014 | Woo | H02M 3/33507 |
| | | | 363/21.01 |
| 2014/0088794 A1* | 3/2014 | Yashiro | G08C 17/02 |
| | | | 701/2 |
| 2014/0191854 A1* | 7/2014 | Lin | G08C 17/02 |
| | | | 340/12.22 |
| 2016/0116895 A1* | 4/2016 | Yagi | G05B 19/058 |
| | | | 700/79 |

FOREIGN PATENT DOCUMENTS

| | | |
|---|---|---|
| JP | H10-282161 A | 10/1998 |
| JP | 2000-78849 A | 3/2000 |
| JP | 3067768 U | 4/2000 |
| JP | 2001-35614 A | 2/2001 |
| JP | 2002-051455 A | 2/2002 |
| JP | 2002-51455 A | 2/2002 |
| JP | 2003-33034 A | 1/2003 |
| JP | 2004-274116 A | 9/2004 |
| JP | 2005-124341 A | 5/2005 |
| JP | 2009-11100 A | 1/2009 |
| JP | 2010-284037 A | 12/2010 |
| JP | 2012-120426 A | 6/2012 |
| JP | 2014-14250 A | 1/2014 |
| JP | 2014-16910 A | 1/2014 |
| JP | 2014-36466 A | 2/2014 |
| KR | 10-2013-0072450 A | 7/2013 |
| WO | 2003-033034 A | 1/2003 |

OTHER PUBLICATIONS

Office action dated Feb. 21, 2017 from Japan Patent Office in a counterpart Japan Patent Application No. 2016-533267.
Office action dated Feb. 27, 2017from China Patent Office in a counterpart China Patent Application No. 201580001748.6.
Masahiko Tsukamoto, Developing Common Specifications of Smart Taps, IPSJ Magazine 51(8), 934-942, Aug. 15, 2010.
European Search Report for EP15768021.6 from European patent office in a counterpart European patent application.

* cited by examiner

OPERATION CONTROL DEVICE FOR ELECTRONIC APPARATUS

CROSS REFERENCE TO RELATED APPLICATION AND CLAIM OF PRIORITY

This patent application claims benefit under 35 U.S.C. 119(e), 120, 121, or 365(c), and is a National Stage entry from International Application No. PCT/KR2015/002036, filed Mar. 4, 2015, which claims priority to Korean Patent Application Nos. 10-2014-0035360 filed in the Korean Intellectual Property Office on Mar. 26, 2014, 10-2014-0071146 filed in the Korean Intellectual Property Office on Jun. 12, 2014, and 10-2014-0134355 filed in the Korean Intellectual Property Office on Oct. 6, 2014, the entire contents of which are incorporated.

BACKGROUND

1. Field

The present disclosure relates to an operation control device for an electronic apparatus, which may transmit power information and product information of the electronic apparatus to a control device, and receive control signals from the control device to control the operation of the electronic apparatus.

2. Discussion of Related Art

In recent years, as a method for controlling the power supply to electronic apparatuses such as TVs, computers, audio devices, and the like, a technology in which a load detection circuit or a power control circuit is built in a socket or a power adaptor (or power strip) connected between a socket and an electronic apparatus to interrupt the power supplied to the electronic apparatus has been disclosed. However, when the load detection circuit, the power control circuit, or the like is built in the socket, the size of the socket is increased or the number of an outlet is reduced so that there is a restriction in the control for each of individual electronic apparatuses. In addition, since the power adaptor can be freely removed by a user, the control of power usage of individual electronic apparatuses is not possible, so that the efficiency in terms of energy demand management understandably decreases in an existing method.

Accordingly, the United Kingdom, the United States, and the like have recently announced a policy to mandate that smart meters with external communication functions should be built in electronic apparatuses within the home, and Korea has also mandated that products cannot be sold unless the smart meter function is built in air conditioners, starting in 2015. However, this results in a cost increase of the electronic apparatus which causes an increase in the cost burden, and at the same time, the above-described policy has many restrictions as a commercialization policy to cope with weather changes and encourage energy saving in that there are many difficulties in adding a power control technique to a digital control technique which is a key technique of the existing electronic apparatus so it takes a long time to replace the existing electronic apparatuses with smart electronic apparatuses. In addition, as an external shock such as lightning due to the weather changes occurs frequently, the damage to expensive smart electronic apparatuses is further increased.

Furthermore, according to the prior art, a user cannot remotely control the operation of the electronic apparatus.

SUMMARY

The present disclosure is directed to providing an operation control device for an electronic apparatus, which can be more easily spread at lower cost as an apparatus for managing and controlling power information and product information of electronic apparatuses used in offices, homes, and the like.

The present disclosure is also directed to providing an operation control device for an electronic apparatus, which can achieve power consumption reduction and real-time power demand management by transmitting power information and product information of the electronic apparatus to an external control device and can even achieve peak power control without user inconvenience.

The present disclosure is also directed to providing an operation control device for an electronic apparatus, which can make after-sales service possible at a low cost while safely protecting an expensive smart electronic apparatus against lightning or the like which occurs frequently due to weather changes.

The present disclosure is also directed to providing an operation control device for an electronic apparatus, which may be essential for an energy management system utilizing ICT and may actively control the electricity use of individual electronic apparatuses in smart-grid businesses in real-time.

One aspect of the present disclosure provides an operation control device for an electronic apparatus, which is connected to the electronic apparatus and transmits and receives signals to and from a control device for remotely controlling the power usage of the electronic apparatus and the electronic apparatus, comprising: a measuring unit that calculates an amount of power supplied to the electronic apparatus; and a communicating unit that receives identification information of the electronic apparatus and state information of the electronic apparatus from the electronic apparatus, transmits information regarding the amount of power, the identification information of the electronic apparatus, and the state information of the electronic apparatus to the control device, receives a first control signal for controlling the operation of the electronic apparatus from the control device, and then transmits the first control signal to the electronic apparatus so that the electronic apparatus is switched into an off mode or a sleep mode.

The operation control device for the electronic apparatus may further include a control unit that controls power supplied to the electronic apparatus, wherein the communicating unit receives a second control signal for controlling the power supplied to the electronic apparatus from the control device, and the control unit interrupts the power supplied to the electronic apparatus according to the second control signal.

The identification information of the electronic apparatus may include at least one of a type, a manufacturer, a date of manufacture, and a serial number of the electronic apparatus.

The state information of the electronic apparatus may include at least one of whether the power of the electronic apparatus is turned ON or OFF, whether the electronic apparatus is operated, a type of an operation mode that is currently operated among a predetermined plurality of operation modes of the electronic apparatus, a time at which the operation of the electronic apparatus is started or terminated, and a remaining operation time until the currently operated operation mode of the electronic apparatus is terminated.

The communicating unit may receive diagnostic information of the electronic apparatus from the electronic apparatus, and transmit the received diagnostic information to the control device.

The diagnostic information of the electronic apparatus may include at least one of the presence or absence of an abnormality of the electronic apparatus and a cause of the abnormality of the electronic apparatus.

The operation control device for the electronic apparatus may further include a cable that connects the communicating unit to the electronic apparatus.

The cable may include a plurality of AC power lines for supplying AC power to the electronic apparatus, a first ground line for grounding the AC power lines, a reception line for receiving at least one of the identification information of the electronic apparatus, the state information of the electronic apparatus, and the diagnostic information of the electronic apparatus from the electronic apparatus, a transmission line for transmitting the first control signal to the electronic apparatus, and a second ground line for grounding the reception line or the transmission line.

The cable may include a DC power line for supplying DC power to the electronic apparatus, a reception line for receiving at least one of the identification information of the electronic apparatus, the state information of the electronic apparatus, and the diagnostic information of the electronic apparatus from the electronic apparatus, a transmission line for transmitting the first control signal to the electronic apparatus, and a third ground line for grounding the DC power line, the reception line or the transmission line.

The operation control device for the electronic apparatus may further include a surge protector for interrupting a surge flowing through the cable.

The operation control device for the electronic apparatus may further include a conversion unit that converts AC power supplied to the operation control device for the electronic apparatus into DC power.

The communicating unit may receive magnitude information of DC power to be supplied to the electronic apparatus from the control device.

The operation control device for the electronic apparatus may further include a DC adjustment unit that receives the magnitude information of the DC power from the communicating unit, and adjusts a value of the DC power to be supplied to the electronic apparatus according to the magnitude information of the DC power.

The operation control device for the electronic apparatus may further include a light-emitting unit that emits light having mutually different colors according to the amount of power calculated by the measuring unit or the state information of the electronic apparatus.

Another aspect of the present disclosure provides an operation control device for an electronic apparatus, which is built or mounted in the electronic apparatus and transmits and receives signals to and from a control device for remotely controlling the power usage of the electronic apparatus and the electronic apparatus, comprising: a measuring unit that calculates an amount of power supplied to the electronic apparatus; and a communication unit that receives identification information of the electronic apparatus and state information of the electronic apparatus from the electronic apparatus, transmits information regarding the amount of power, the identification information of the electronic apparatus, and the state information of the electronic apparatus to the control device, receives a first control signal for controlling the operation of the electronic apparatus from the control device, and then transmits the first control signal to the electronic apparatus so that the electronic apparatus is switched into an off mode or a sleep mode.

The operation control device for an electronic apparatus may further include a control unit that controls power supplied to the electronic apparatus, wherein the communicating unit receives a second control signal for controlling the power supplied to the electronic apparatus from the control device, and the control unit interrupts the power supplied to the electronic apparatus according to the second control signal.

The identification information of the electronic apparatus may include at least one of a type, a manufacturer, a date of manufacture, and a serial number of the electronic apparatus.

The state information of the electronic apparatus may include at least one of whether the power of the electronic apparatus is turned ON or OFF, whether the electronic apparatus is operated, a type of an operation mode that is currently operated among a predetermined plurality of operation modes of the electronic apparatus, a time at which the operation of the electronic apparatus is started or terminated, and a remaining operation time until the currently operated operation mode of the electronic apparatus is terminated.

The communication unit may receive diagnostic information of the electronic apparatus from the electronic apparatus, and transmit the received diagnostic information to the control device.

The diagnostic information of the electronic apparatus may include at least one of presence or absence of an abnormality of the electronic apparatus and a cause of the abnormality of the electronic apparatus.

The operation control device for the electronic apparatus may further include a plurality of pins that connect the communication unit to the electronic apparatus.

The plurality of pins may include a plurality of AC power pins for supplying AC power to the electronic apparatus, a first ground pin for grounding the AC power pins, a reception pin for receiving at least one of the identification information of the electronic apparatus, the state information of the electronic apparatus, and the diagnostic information of the electronic apparatus from the electronic apparatus, a transmission pin for transmitting the first control signal to the electronic apparatus, and a second ground pin for grounding the reception pin or the transmission pin.

The plurality of pins may include a DC power pin for supplying DC power to the electronic apparatus, a reception pin for receiving at least one of the identification information of the electronic apparatus, the state information of the electronic apparatus, and the diagnostic information of the electronic apparatus from the electronic apparatus, a transmission pin for transmitting the first control signal to the electronic apparatus, and a third ground pin for grounding the DC power pin, the reception pin or the transmission pin.

The operation control device for the electronic apparatus may further include a surge protector for interrupting a surge flowing through the plurality of pins.

The operation control device for the electronic apparatus may further include a conversion unit that converts AC power supplied to the operation control device for the electronic apparatus into DC power.

The communicating unit may receive magnitude information of DC power to be supplied to the electronic apparatus from the control device.

The operation control device for the electronic apparatus may further include a DC adjustment unit that receives the magnitude information of the DC power from the communicating unit, and adjusts a value of the DC power to be supplied to the electronic apparatus according to the magnitude information of the DC power.

The operation control device for the electronic apparatus may further include a light-emitting unit that emits light having mutually different colors according to the amount of power calculated by the measuring unit or the state information of the electronic apparatus.

According to embodiments of the present disclosure, information about an amount of power supplied to an electronic apparatus and identification and state information of the electronic apparatus may be transmitted to a control device, and the electronic apparatus may be switched into an off mode or a sleep mode according to control signals received from the control device, and therefore it is possible to perform efficient power demand management and peak power control at lower costs, and fundamentally prevent rolling blackouts and blackouts. In addition, diagnostic information of the electronic apparatus may be transmitted to the control device, and therefore remote control of the electronic apparatus for after-sales service can be made possible. The operation control device for an electronic apparatus according to the embodiments of the present disclosure can be established as an important node in the IOT (Internet Of Things) age, and can have a sufficiently large effect in terms of spreading an energy management system worldwide.

In addition, according to the embodiments of the present disclosure, through an operation control device for an electronic apparatus, which is connected to the electronic apparatus or built or mounted in the electronic apparatus, power supplied to the electronic apparatus may be controlled, and therefore it is possible to perform individual power monitoring and management together with electricity-saving due to interruption of communication standby power and wasted power for individual electronic apparatuses. In addition, in order to use the electronic apparatus, the operation control device for the electronic apparatus should be necessarily inserted into a power supply unit or connected to the power supply unit through a power plug, an adaptor, or the like, and therefore the control of a power management object can be fully achieved.

Further, according to the embodiments of the present disclosure, a power management circuit may not be required to be added within a smart electronic apparatus for the purpose of power monitoring and management, and therefore it is possible to reduce costs required for enabling the power management circuit to be built in the smart electronic apparatus and shorten the replacement period of the smart electronic apparatus. This may contribute to the acceleration of the introduction of the energy management system for energy saving and peak power management, and therefore it is possible to build a power demand management system within a quick period in a simpler and cheaper way.

DETAILED DESCRIPTION OF EXEMPLARY EMBODIMENTS

Hereinafter, specific embodiments of the present disclosure will be described with reference to the accompanying drawings. However, this is merely for exemplary purposes and the present disclosure is not limited thereto.

In the following descriptions of the disclosure, when specific description of known technology regarding the disclosure obscures the subject matter of the present disclosure, the corresponding detailed description will be omitted. The terminology described below is defined in consideration of functions in the present disclosure and may vary according to a user's or operator's intention or usual practice. Thus, the definitions of the terminology should be interpreted based on the overall context of the present specification.

Figure 1:
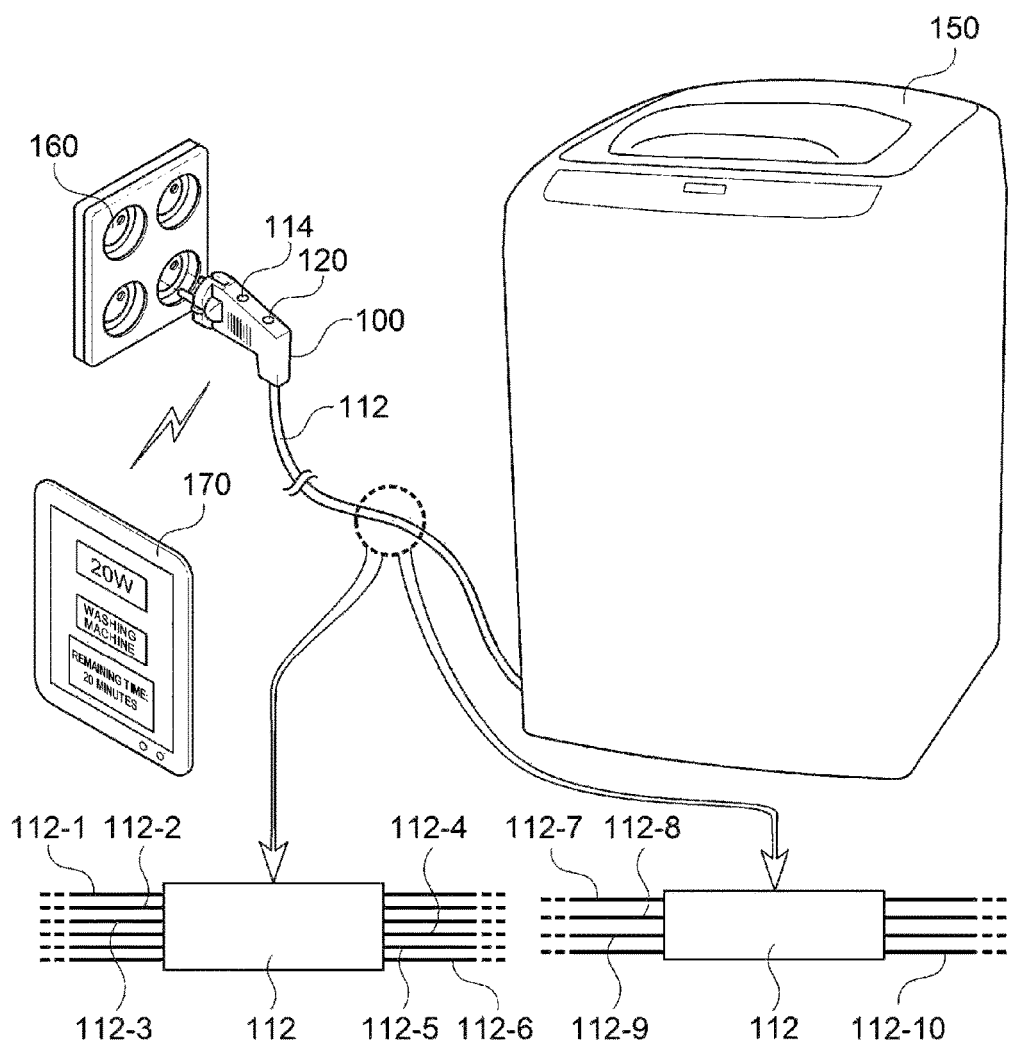
FIG. 1 is a schematic view showing a plug type-operation control device for an electronic apparatus according to a first embodiment of the present disclosure.

FIG. 1 is a schematic view showing an operation control device for a plug type-electronic apparatus according to a first embodiment of the present disclosure. As shown in FIG. 1, an operation control device 100 for an electronic apparatus may be connected to an electronic apparatus 150 and a power supply unit 160, and may be, for example, a power plug. The electronic apparatus 150 is a device that is operated by receiving power supplied from the outside, and may be, for example, a TV (television), a washing machine, a PC, a refrigerator, a laptop, an audio device, a lighting device, or the like. The power supply unit 160 is a device for supplying power to the electronic apparatus 150, and may be, for example, a socket. The operation control device 100 for an electronic apparatus may receive power from the power supply unit 160, and transmit the received power to the electronic apparatus 150. In addition, a control device 170 is a device for remotely managing and controlling information about the power supplied to the electronic apparatus 150 and product information (identification information, state information, and diagnostic information of the electronic apparatus 150) of the electronic apparatus 150, and may be, for example, a wireless terminal such as a smart phone or a wireless switch.

The operation control device 100 for an electronic apparatus may transmit and receive signals to and from the control device 170 through a communicating unit (or a communication module) (not shown). The control device 170 may wirelessly communicate with the operation control device 100 for an electronic apparatus in conjunction with a central server (not shown). In the vicinity (for example, within a 100-$m$ radius) of the operation control device 100 for an electronic apparatus, a gateway (not shown) may be installed, and the control device 170 may wirelessly communicate with the operation control device 100 for an electronic apparatus directly or through the gateway. The control device 170 may wirelessly communicate directly with the operation control device 100 for an electronic apparatus, or wirelessly communicate with the gateway (not shown) through the Internet. Here, as the wireless communication method, a Zigbee communication method, a Wi-Fi communication method, a Bluetooth communication method, or the like may be used.

In addition, the operation control device 100 for an electronic apparatus may transmit and receive signals to and from the electronic apparatus 150 through a communicating unit. A cable 112 of the operation control device 100 for an electronic apparatus may be connected to each of the communicating unit and the electronic apparatus 150. The electronic apparatus 150 may include a communication port (not shown), and the cable 112 may be connected to the communication port.

As shown in FIG. 1, a plurality of AC power lines (AC_L and AC_N; 112-1 and 112-2) for supplying AC power to the electronic apparatus 150 and a first ground line 112-3 for grounding the AC power lines 112-1 and 112-2 may be built in the cable 112.

In addition, a reception line 112-4 and a transmission line 112-5 for receiving and transmitting signals from and to the electronic apparatus 150, and a second ground line 112-6 may be additionally built in the cable 112.

The reception line 112-4 may receive various signals from the electronic apparatus 150, and the transmission line 112-5 may transmit various signals to the electronic apparatus 150. In addition, the second ground line 112-6 may ground the reception line 112-4 or the transmission line 112-5. According to the embodiments of the present disclosure, unlike a cable of a conventional power plug, the communication lines 112-4, 112-5, and 112-6 may be additionally built in the cable, and thereby may directly transmit and receive signals to and from the electronic apparatus 150. In addition, the cable 112 may supply DC power to the electronic apparatus 150. In this case, in the cable 112, a DC power line 112-7 for supplying DC power to the electronic apparatus 150, a reception line 112-8 and a transmission line 112-9 for transmitting and receiving signals to and from the electronic apparatus 150, and a third ground line 112-10 may be built. That is, the power supply unit 160 may supply the AC power or the DC power to the operation control device 100 for an electronic apparatus, and the cable 112 may include the above-described plurality of lines according to the power type.

The operation control device 100 for an electronic apparatus may receive identification information, state information, and diagnostic information of the electronic apparatus 150 from the electronic apparatus 150 through the communicating unit. The identification information of the electronic apparatus 150 may include, for example, at least one of a type, a manufacturer, a date of manufacture, and a serial number of the electronic apparatus 150. In addition, the state of the electronic apparatus 150 may include, for example, at least one of whether the power of the electronic apparatus 150 is turned ON or OFF, whether the electronic apparatus 150 is operating, a type of an operation mode that is currently operated among a predetermined plurality of operation modes of the electronic apparatus 150, a time at which the operation of the electronic apparatus 150 is started or terminated, and a remaining operation time until the currently operated operation mode of the electronic apparatus 150 is terminated. Here, the operation mode of the electronic apparatus 150 may vary according to the type of the electronic apparatus 150, and in the case of, for example, a TV, a type of an output channel may be the operation mode. Also, in the case of a washing machine, an operation state such as washing, rinsing, spin-drying, or the like may be the operation mode, and in the case of a refrigerator, the temperature of discharged cold air may be the operation mode. In addition, in the case of a washing machine, the remaining time until the currently operated operation mode of the electronic apparatus is terminated may be, for example, a remaining time until a "washing" operation mode is terminated (for example, 20 minutes). In this instance, each of the operation modes of the electronic apparatus 150 may be set in advance to be operated for a predetermined time. In addition, the diagnostic information of the electronic apparatus 150 may include, for example, at least one of the presence or absence of an abnormality of the electronic apparatus 150 and a cause of the abnormality of the electronic apparatus. Here, the abnormality of the electronic apparatus 150 refers to a state in which the electronic apparatus 150 is out of a predetermined normal range reference due to a defect of hardware (parts, or the like) constituting the electronic apparatus 150 or an error of software (program, application, or the like) built in the electronic apparatus 150, as a state in which the electronic apparatus 150 is not normally operating. The cause of an abnormality of the electronic apparatus may be, for example, a type of hardware in which a defect occurs or a type of software in which an error occurs.

The operation control device 100 for an electronic apparatus may transmit the identification information, the state information, and the diagnostic information of the electronic apparatus 150 having been received from the electronic apparatus 150, to the control device 170 through the communicating unit, and a user may confirm the received information in real-time through the control device 170. For example, the user may monitor a type of the electronic apparatus 150 (for example, "washing machine"), whether the electronic apparatus 150 is operating (for example, "in operation"), a type of the currently operated operation mode of the electronic apparatus 150 (for example, "washing"), a remaining operation time until the currently operated operation mode of the electronic apparatus 150 is terminated (for example, "remaining time: 20 minutes"), and the like in real-time through the control device 170. In addition, the user may monitor the presence or absence of the abnormality of the electronic apparatus 150 (for example, "there is an abnormality in the washing machine"), the cause of the abnormality of the electronic apparatus 150 (for example, there is an abnormality in a laundry tub of the washing machine), and the like. Meanwhile, "operation (or movement) of the electronic apparatus 150" described in the specification of the disclosure refers to a state in which the electronic apparatus 150 is operated according to its purpose, and may be, for example, a state in which an image is output on a screen so that a user can view the output image in the case of a TV, a state in which water is discharged or a laundry tub is moved so that the laundry can be washed in the case of a washing machine, a state in which cold air having a specific temperature or lower is discharged so that foods stored within a refrigerator can be refrigerated in the case of the refrigerator, a state in which music is output in the case of an audio device, and the like.

A user may input a command for switching the electronic apparatus 150 into an off mode or a sleep mode to the control device 170 through various methods such as a button input method, a touch method, and the like, so that the control device 170 may generate a first control signal. The operation control device 100 for an electronic apparatus may receive the first control signal from the control device 170, and transmit the received first control signal to the electronic apparatus 150, thereby switching the electronic apparatus 150 into the off mode or the sleep mode. Here, the off mode refers to a state in which the operation of the electronic apparatus 150 is stopped so that only predetermined standby power remains. For example, when the electronic apparatus 150 is assumed to be an air conditioner, the off mode may be a state in which the blowing of the air conditioner is stopped. The power supplied to the electronic apparatus 150 in the off mode state may be 0.5 W or less. In addition, the sleep mode refers to a state in which the electronic apparatus 150 stands by so as to be rapidly returned to a state which has been stopped when the operation of the electronic apparatus 150 starts, while the operation of the electronic apparatus 150 is stopped in a current state or a preset state. For example, when the electronic apparatus 150 is assumed to be a laptop, the sleep mode may be a system standby mode. The power supplied to the electronic apparatus 150 in the sleep mode state may be, for example, 0.8 W or less. That is, according to the embodiments of the present disclosure, the operation of the electronic apparatus 150 may be actively controlled through the control device 170 while identification information of the electronic apparatus 150, state information of the electronic apparatus 150, information regarding an amount of power supplied to the electronic apparatus 150, which will be described below, and the like are monitored in real-time, so that it is possible to perform efficient power demand management and peak power control at a lower cost and to fundamentally prevent rolling blackouts and blackouts. In addition, according to the embodiments of the present disclosure, diagnostic information of the electronic apparatus 150 may be transmitted to the control device 170, so that remote diagnosis of the electronic apparatus 150 for after-sales service may be made possible.

In addition, the operation control device 100 for an electronic apparatus may calculate an amount of power supplied to the electronic apparatus 150, and transmit information regarding the calculated amount of power to the control device 170.

A user may monitor the amount of power (for example, "20 W") supplied to the electronic apparatus 150 in real-time through the control device 170. In addition, the user may input a command for interrupting the power supply to the electronic apparatus 150 to the control device 170 through various methods such as a button input method, a touch method, and the like, so that the control device 170 may generate a second control signal. The operation control device 100 for an electronic apparatus may receive the second control signal from the control device 170, and interrupt the power supply to the electronic apparatus 150 according to the second control signal. Meanwhile, "the power supply to the electronic apparatus 150" described in the specification of the disclosure may be collectively used to have meanings such as supplying power corresponding to an amount of standby power which is consumed in a state in which the electronic apparatus 150 is connected to the power supply unit 160 even though the electronic apparatus 150 is not operated, as well as supplying power sufficient to operate the electronic apparatus 150. The "interruption of the power supply to the electronic apparatus 150" described in the specification of the disclosure refers to complete interruption of all power supplied to the electronic apparatus 150, that is, power including even the standby power.

Meanwhile, as shown in FIG. 1, a light-emitting unit 114 may be formed on the outer surface of the operation control device 100 for an electronic apparatus. The light-emitting unit 114 may emit light having different colors depending on the amount of power supplied to the electronic apparatus 150 or the state information of the electronic apparatus 150. For example, the light-emitting unit 114 may emit blue light when the amount of power supplied to the electronic apparatus 150 is 50 W or larger, and emit red light when the amount of power is 5 W or less. In addition, the light-emitting unit 114 may emit light having a different color in each of the cases in which the electronic apparatus 150 is operated in a power-on state, the electronic apparatus 150 is not operated in the power-on state, and the electronic apparatus 150 is in a power-off state.

In addition, as shown in FIG. 1, a reset button 120 may be formed on the outer surface of the operation control device 100 for an electronic apparatus. A user may initialize the operation control device 100 for an electronic apparatus by pressing the reset button 120. Hereinafter, with reference to FIGS. 2 and 3, the detailed configuration of the operation control device 100 for an electronic apparatus according to the embodiments of the present disclosure will be described.

Figure 2:
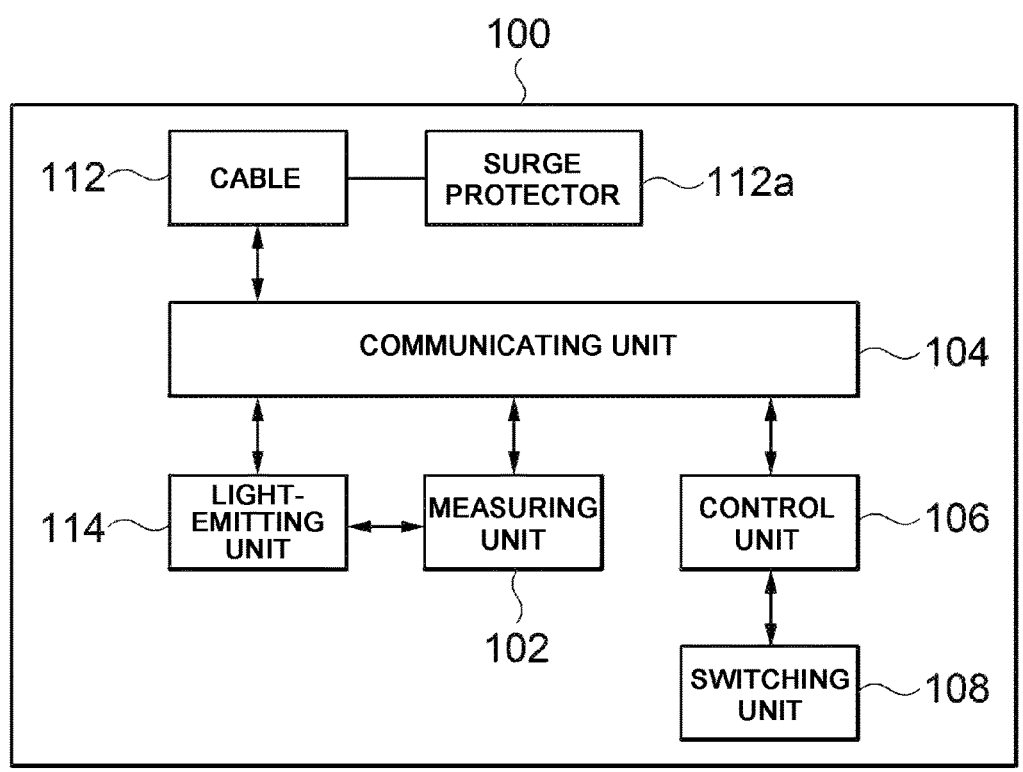
FIG. 2 is a block diagram showing a detailed configuration of an operation control device for an electronic apparatus according to the embodiments of the present disclosure.

FIG. 2 is a block diagram showing the detailed configuration of the operation control device 100 for an electronic apparatus according to the embodiments of the present disclosure. As shown in FIG. 2, the operation control device 100 for an electronic apparatus according to a first embodiment of the present disclosure includes a measuring unit 102, a communicating unit 104, a control unit 106, a switching unit 108, a cable 112, and a light-emitting unit 114.

The measuring unit 102 is a device for calculating an amount of power supplied to the electronic apparatus 150. The amount of power may be, for example, an amount of real-time power usage, daily power consumption, monthly power consumption, or the like. The measuring unit 102 may detect a load current and a load voltage supplied to the electronic apparatus 150, and calculate the amount of power supplied to the electronic apparatus 150 based on the detected load current and load voltage. As described above, the light-emitting unit 114 may emit light having mutually different colors according to the amount of power calculated by the measuring unit 102. For example, the light-emitting unit 114 may emit blue light when the amount of power calculated by the measuring unit 102 is 50 W or larger, and emit red light when the amount of power calculated by the measuring unit 102 is 5 W or less.

A user may easily determine the amount of power supplied to the electronic apparatus 150 through the light-emitting unit 114.

The communicating unit 104 may transmit and receive various signals to and from the electronic apparatus 150 and the control device 170. First, the communicating unit 104 may receive identification information, state information, and diagnostic information of the electronic apparatus 150 from the electronic apparatus 150, and transmit a first control signal having been received from the control device 170 to the electronic apparatus 150. The communicating unit 104 may be connected to a communication port (not shown) of the electronic apparatus 150 through the cable 112. The communication port of the electronic apparatus 150 may be connected to a CPU (central processing unit, not shown) that controls the operation of the electronic apparatus 150 and determines and analyzes the presence or absence of an abnormality of the electronic apparatus 150 and a cause of the abnormality thereof. The CPU may manage product information (identification information, the state information, and the diagnostic information of the electronic apparatus 150) of the electronic apparatus 150.

In the case of an electronic apparatus 150, which consumes a large amount of electricity, such as an air conditioner or the like, primary switching (interruption of the operation) of the electronic apparatus 150 to an off mode or a sleep mode rather than complete interruption of the power supply may be more useful in the peak power management. In addition, in the case of such an electronic apparatus 150, sudden interruption of the power supply may result in the risk of a failure of the electronic apparatus 150. Accordingly, the operation control device 100 for an electronic apparatus according to the embodiments of the present disclosure may interrupt the power supply to the electronic apparatus 150 and switch the electronic apparatus 150 into the off mode or the sleep mode, as will be described below.

First, the communicating unit 104 may receive the identification information and state information of the electronic apparatus 150 from the electronic apparatus 150. The communicating unit 104 may transmit the identification information and state information of the electronic apparatus 150 to the control device 170, and a user may monitor the received information in real-time through the control device 170. For example, the user may monitor a type of the currently operated operation mode of the electronic apparatus 150 (for example, "washing machine"), whether the electronic apparatus 150 is operating (for example, "in operation"), a type of the currently operated operation mode of the electronic apparatus 150 (for example, "washing"), a remaining operation time until the currently operated operation mode of the electronic apparatus 150 is terminated (for example, "remaining time: 20 minutes"), and the like in real-time through the control device 170. The user may input a command for switching the electronic apparatus 150 into the off mode or the sleep mode to the control device 170, so that the control device 170 may generate a first control signal. The communicating unit 104 may receive the first control signal from the control device 170 and transmit the received first control signal to the electronic apparatus 150.

Next, the communicating unit 104 may switch the electronic apparatus 150 into the off mode or the sleep mode by transmitting the first control signal to the electronic apparatus 150. As described above, the communicating unit 104 may transmit the first control signal to the electronic apparatus 150 through the cable 112. The cable 112 may be connected to the communication port of the electronic apparatus 150, and the electronic apparatus 150 may be switched into the off mode or the sleep mode according to the first control signal received through the cable 112. For example, when the electronic apparatus 150 is a washing machine, an operation of the washing machine such as washing, rinsing, spin-drying, or the like is stopped according to the first control signal received through the communicating unit 104 and the cable 112, so that the washing machine may be switched into the off mode or the sleep mode. In this case, the operation of the electronic apparatus 150 is stopped so that the electronic apparatus 150 is switched into the off mode or the sleep mode, but the standby power of the electronic apparatus 150 is not interrupted. That is, according to the embodiments of the present disclosure, the electronic apparatus 150 is switched into the off mode or the sleep mode while the supply of the standby power to the electronic apparatus 150 is maintained, so that it is possible to prevent damage to the electronic apparatus 150 due to sudden power interruption and flexibly perform peak power management.

In addition, the operation control device 100 for an electronic apparatus according to the embodiments of the present disclosure may receive diagnostic information of the electronic apparatus 150 from the electronic apparatus 150 through the communicating unit 104 and transmit the received diagnostic information to the control device 170, so that it is possible to enable a user to remotely confirm the diagnostic information of the electronic apparatus 150. The user may monitor the presence or absence of an abnormality of the electronic apparatus 150 and a cause of the abnormality thereof in real-time, so that it is possible to efficiently and rapidly respond to the occurrence of the abnormality of the electronic apparatus 150 when the abnormality of the electronic apparatus 150 occurs, and therefore the efficiency of after-sales service may be improved.

In addition, the communicating unit 104 may transmit information regarding the amount of power calculated by the calculating unit 102 to the control device 170. A user may monitor the amount of power supplied to the electronic apparatus 150 in real-time through the control device 170. In addition, the user may input a command for interrupting the power supply to the electronic apparatus 150 to the control device 170 in various methods such as a button input method, a touch method, and the like, so that the control device 170 may generate a second control signal. The communicating unit 104 may receive the second control signal from the control device 170, and transmit the received second control signal to the control unit 106.

The control unit 106 may interrupt the power supply to the electronic apparatus 150 according to the second control signal. The control unit 106 may be connected to the switching unit 108, and interrupt the power supply to the electronic apparatus 150 by controlling the operation of the switching unit 108 according to the second control signal.

The switching unit 108 may allow the connection between a terminal pin (not shown) connected to the power supply unit 160 and the power lines (AC power lines 112-1 and 112-2 or a DC power line 112-7) to be mechanically turned ON/OFF. When the switching unit 108 allows the connection between the terminal pin and the power lines (AC power lines 112-1 and 112-2 or the DC power line 112-7) to be turned OFF, even the standby power supplied to the electronic apparatus 150 may be completely interrupted. According to the embodiments of the present disclosure, the power supplied to the electronic apparatus 150 may be remotely interrupted when the electronic apparatus 150 is not used or when a user goes out, so that it is possible to reduce unnecessary power consumption.

The cable 112 may be connected to each of the communicating unit 104 and the electronic apparatus 150 to supply power to the electronic apparatus 150, and transmit and receive signals to and from the electronic apparatus 150.

First, the cable 112 may supply AC power to the electronic apparatus 150. For this, a plurality of AC power lines (AC_L and AC_N; 112-1 and 112-2) for supplying AC power to the electronic apparatus 150 and a first ground line 112-3 for grounding the AC power lines 112-1 and 112-2 may be built in the cable 112. In addition, the cable 112 may supply DC power to the electronic apparatus 150, and in this case, the DC power line 112-7 for supplying the DC power to the electronic apparatus 150 and a third ground line 112-10 for grounding the DC power line 112-7 may be built in the cable 112.

In addition, the cable 112 may be connected to the electronic apparatus 150 to transmit and receive signals. For this, reception lines 112-4 and 112-8 for receiving signals from the electronic apparatus 150, transmission lines 112-5 and 112-9 for transmitting signals to the electronic apparatus 150, and a ground line (a second ground line 112-6 or the third ground line 112-10) for grounding the reception lines 112-4 and 112-8 or the transmission lines 112-5 and 112-9 may be additionally built in the cable 112.

The reception lines 112-4 and 112-8 may receive identification information, state information, and diagnostic information of the electronic apparatus 150 from the electronic apparatus 150, and the transmission lines 112-5 and 112-9 may transmit the first control signal to the electronic apparatus 150. Here, the reception lines 112-4 and 112-8 may simultaneously or sequentially receive the identification information, state information, and diagnostic information of the electronic apparatus 150 from the electronic apparatus 150.

Meanwhile, the operation control device 100 for an electronic apparatus may further include a surge protector 112*a* for interrupting a surge flowing through the cable 112. The surge refers to an electrical current, voltage, or a transient waveform of power having characteristics such that it is transmitted along wires or electrical circuits and is rapidly increased for a short time and gradually reduced. In general, the surge may be generated due to lightning or the like, and communication systems or electronic apparatuses within a building may be damaged by the surge. Thus, according to the embodiments of the present disclosure, the surge flowing in the cable 112 may be interrupted through the surge protector 112*a*. The surge protector 112*a* may interrupt, suppress, or bypass overcurrent or overvoltage which momentarily flows through the cable 112. The surge protector 112*a* may be connected to each line within the cable 112, and there may be various methods in which the surge protector 112*a* interrupts the surge flowing through the cable 112. For example, when the current flowing through the cable 112 is a preset value or larger, the surge protector 112*a* may determine the current to be the surge, and interrupt the determined current. According to the embodiments of the present disclosure, it is possible to safely protect the electronic apparatus 150 against lightning or the like which occurs frequently due to weather changes.

The light-emitting unit 114 may emit light having mutually different colors depending on the amount of power calculated by the measuring unit 102 or the state information of the electronic apparatus 150. For example, the light-emitting unit 114 may emit blue light when the amount of power calculated by the measuring unit 102 is 50 W or larger, and emit red light when the amount of power calculated by the measuring unit 102 is 5 W or less. In addition, the light-emitting unit 114 may emit light having a different color in each of the cases in which the electronic apparatus 150 is operated in a power-on state, the electronic apparatus 150 is not operated in the power-on state, and the electronic apparatus is in a power-off state. A user may confirm whether the power of the electronic apparatus 150 is turned ON or OFF, whether the electronic apparatus 150 is operating, whether the standby power is interrupted, and the like through the light-emitting unit 114. The light-emitting unit 114 may be, for example, an LED, and may be positioned on the outer surface of the operation control device 100 for an electronic apparatus.

Figure 3:
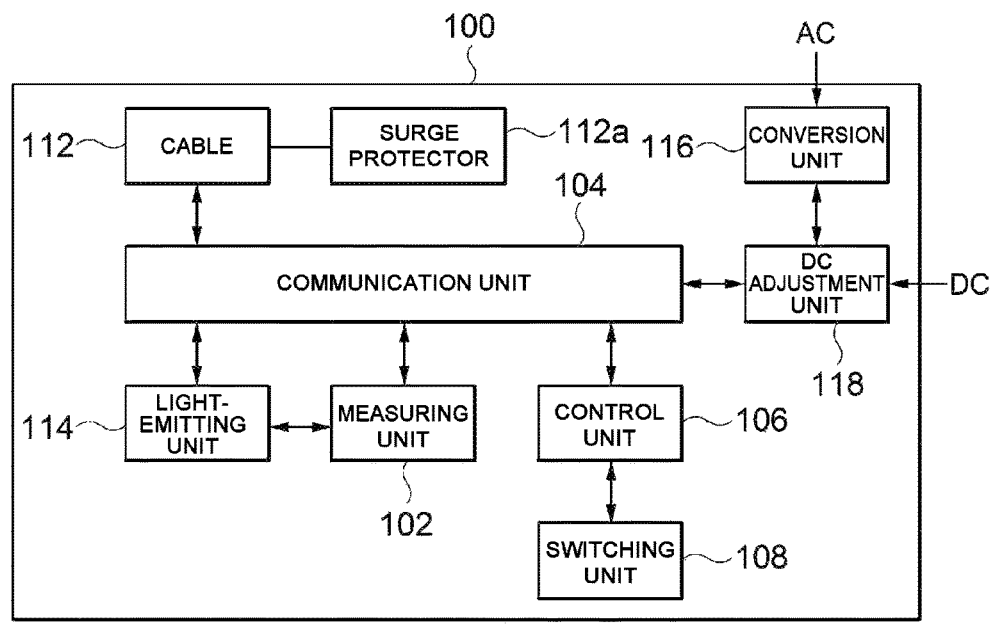
FIG. 3 is a block diagram showing a detailed configuration of an operation control device for an electronic apparatus according to embodiments of the present disclosure.

FIG. 3 is a block diagram showing a detailed configuration of the operation control device 100 for an electronic apparatus according to embodiments of the present disclosure. The operation control device 100 for an electronic apparatus shown in FIG. 3 has the same configuration as that in FIG. 2, except that a conversion unit 116 and a DC adjustment unit 118 are added. The components described in FIG. 2 are shown using the same reference numerals in FIG. 3, and a repeated description thereof will be omitted.

The conversion unit 116 converts AC power supplied to the operation control device 100 for an electronic apparatus into DC power. A conventional power plug supplies the AC power to the electronic apparatus 150, and the electronic apparatus 150 internally converts the supplied AC power into the DC power having a predetermined magnitude. The electronic apparatus is required to use the DC power, but the conventional power plug generally transmits and receives the AC power due to a loss or the like in the transmission process. However, according to the embodiments of the present disclosure, the conversion unit 116 for converting the AC power into the DC power may be built in the operation control device 100 for an electronic apparatus, and therefore separate power conversion is not required in the electronic apparatus 150.

The DC adjustment unit 118 adjusts a value of the DC power to be supplied to the electronic apparatus 150. First, the communicating unit 104 may receive magnitude information of the DC power to be supplied to the electronic apparatus 150, from the control device 170. The magnitude information of the DC power may be generated according to a user's input, or automatically generated according to the identification information of the electronic apparatus 150. For example, when the electronic apparatus 150 is a laptop using 24 V, the communicating unit 102 may receive the magnitude information of the DC power of 24 V from the control device 170.

The DC adjustment unit 118 may receive the magnitude information of the DC power from the communicating unit 104, and adjust the value of the DC power to be supplied to the electronic apparatus 150 according to the magnitude information of the DC power. The DC adjustment unit 118 may be connected to the conversion unit 116, and in this case, adjust the value of the DC power converted by the conversion unit 116 according to the magnitude information of the DC power. In addition, the DC adjustment unit 118 may receive DC power directly from the outside (without a separate conversion process), and adjust a value of the received DC power according to the magnitude information of the DC power. A loss of the power may occur during a process for converting the AC power into the DC power, so that according to the embodiments of the present disclosure, the DC power may be received directly from the operation control device 100 for an electronic apparatus, and a value of the received DC power may be converted according to the type of the electronic apparatus 150, thereby minimizing the loss of the power supplied to the electronic apparatus 150.

Figure 4:
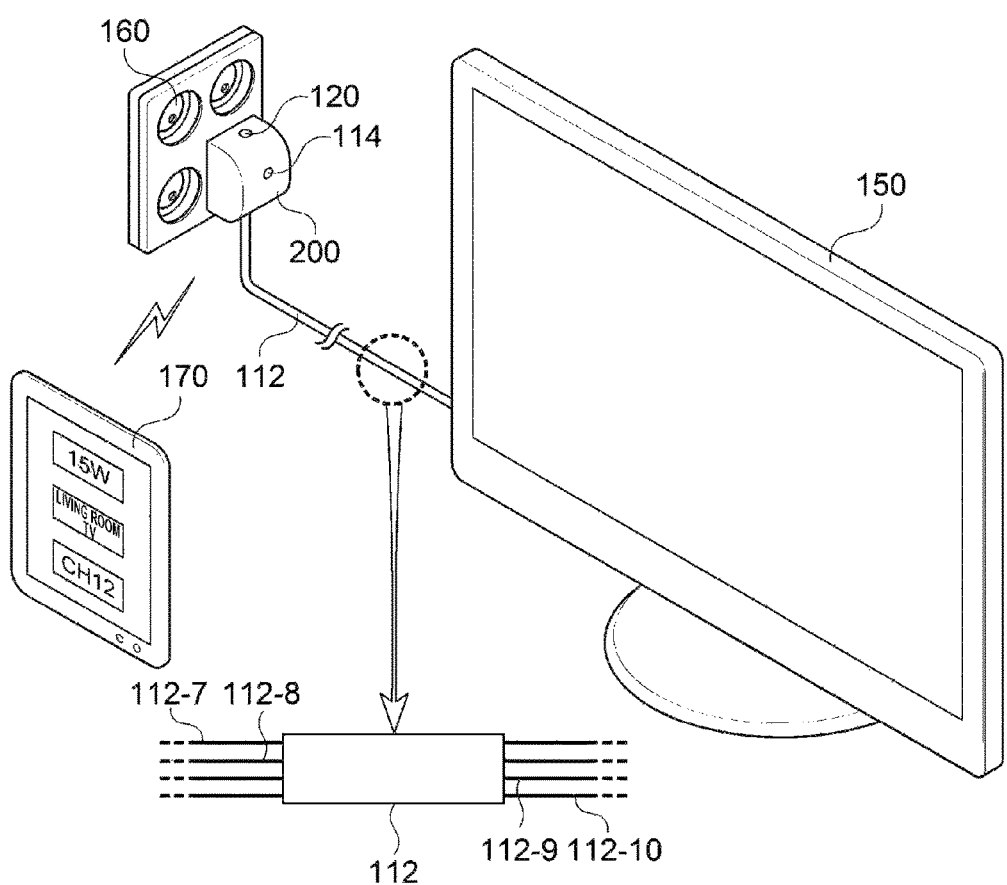
FIG. 4 is a schematic view showing an adaptor type-operation control device for an electronic apparatus according to a second embodiment of the present disclosure.
Figure 5:
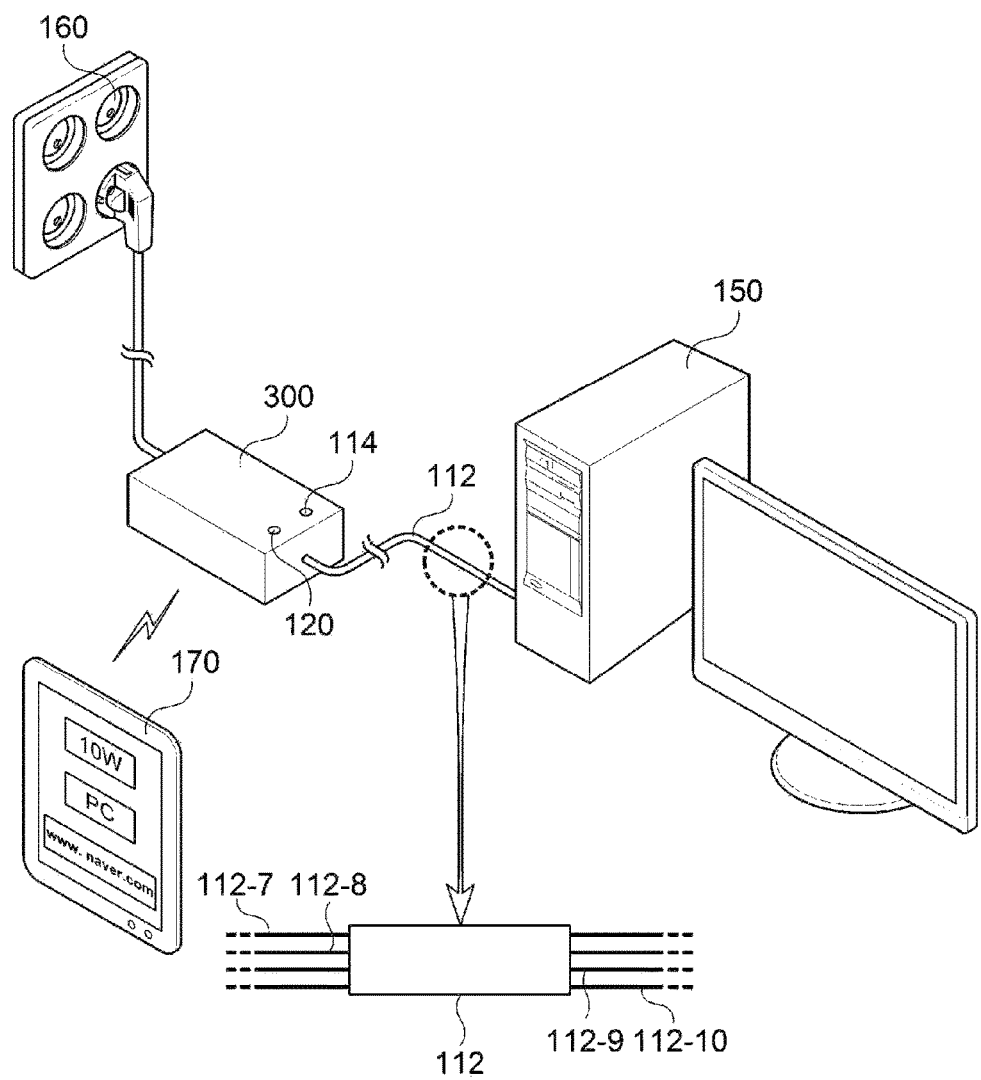
FIG. 5 is a schematic view showing an adaptor type-operation control device for an electronic apparatus according to a third embodiment of the present disclosure.

FIGS. 4 and 5 are schematic views showing an operation control device 200 for an electronic apparatus according to second and third embodiments of the present disclosure. As shown in FIGS. 4 and 5, the operation control devices 200 and 300 for an electronic apparatus according to the second and third embodiments of the present disclosure may be connected to the electronic apparatus 150 and the power supply unit 160, and may be, for example, an adaptor. The operation control devices 200 and 300 for an electronic apparatus may perform the same function as that of the above-described operation control device 100 for an electronic apparatus. As shown in FIGS. 4 and 5, the cable 112 may supply the DC power to the electronic apparatus 150. In this case, a DC power line 112-7 for supplying DC power to the electronic apparatus 150, a reception line 112-8 and a transmission line 112-9 for transmitting and receiving signals to and from the electronic apparatus 150, and a third ground line 112-10 may be built in the cable 112. In addition, as shown in FIG. 5, the electronic apparatus 150 may be, for example, a PC, and a user may monitor a type of the electronic apparatus 150 (for example, "PC"), whether the electronic apparatus 150 is operating (for example, "in operation"), a type of a currently operated operation mode of the electronic apparatus 150 (for example, "URL: www-.naver.com" which is currently connected), and the like in real-time. Description of the detailed configuration of the operation control devices 200 and 300 for an electronic apparatus is the same as that described above, and thus detailed description thereof will be omitted.

Figure 6:
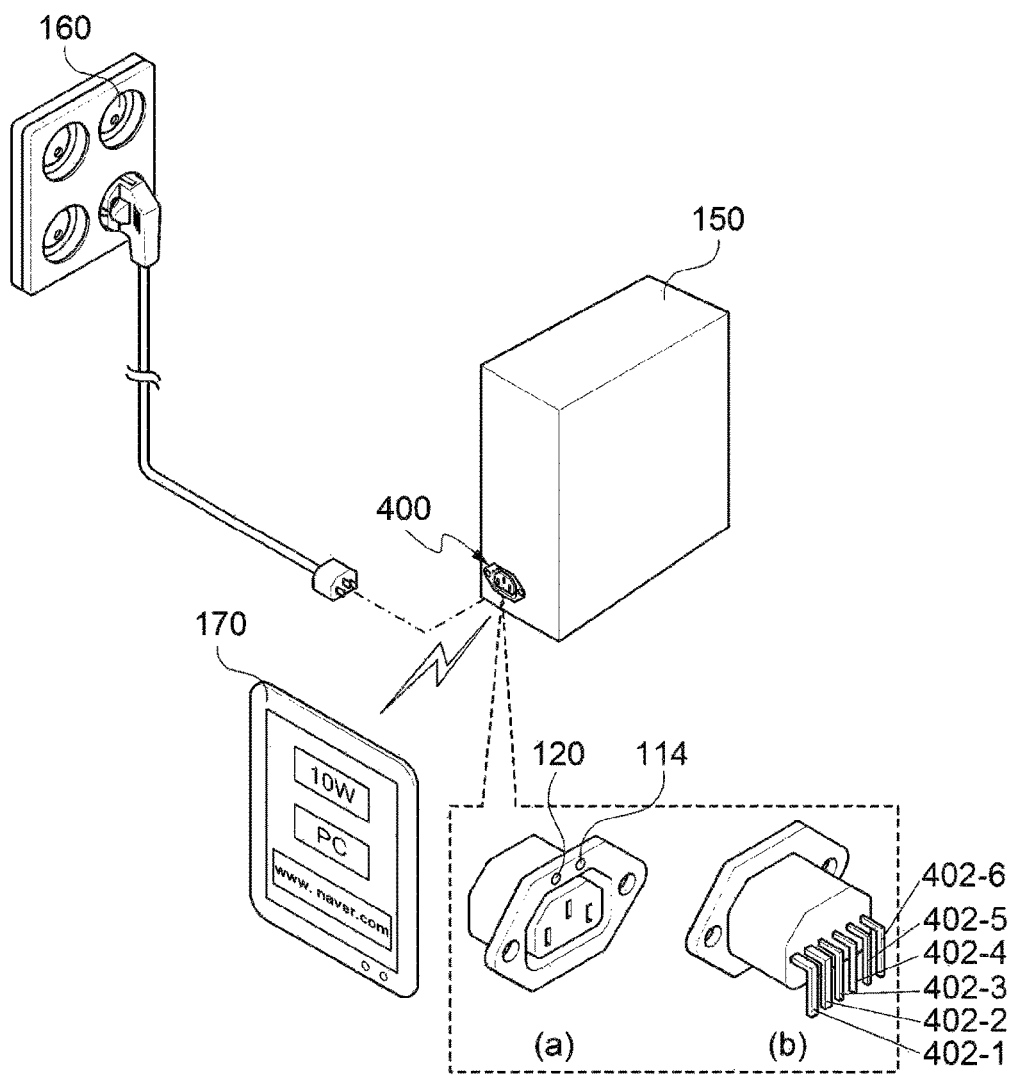
FIG. 6 is a schematic view showing an electrical socket type-operation control device for an electronic apparatus according to a fourth embodiment of the present disclosure.
Figure 7:
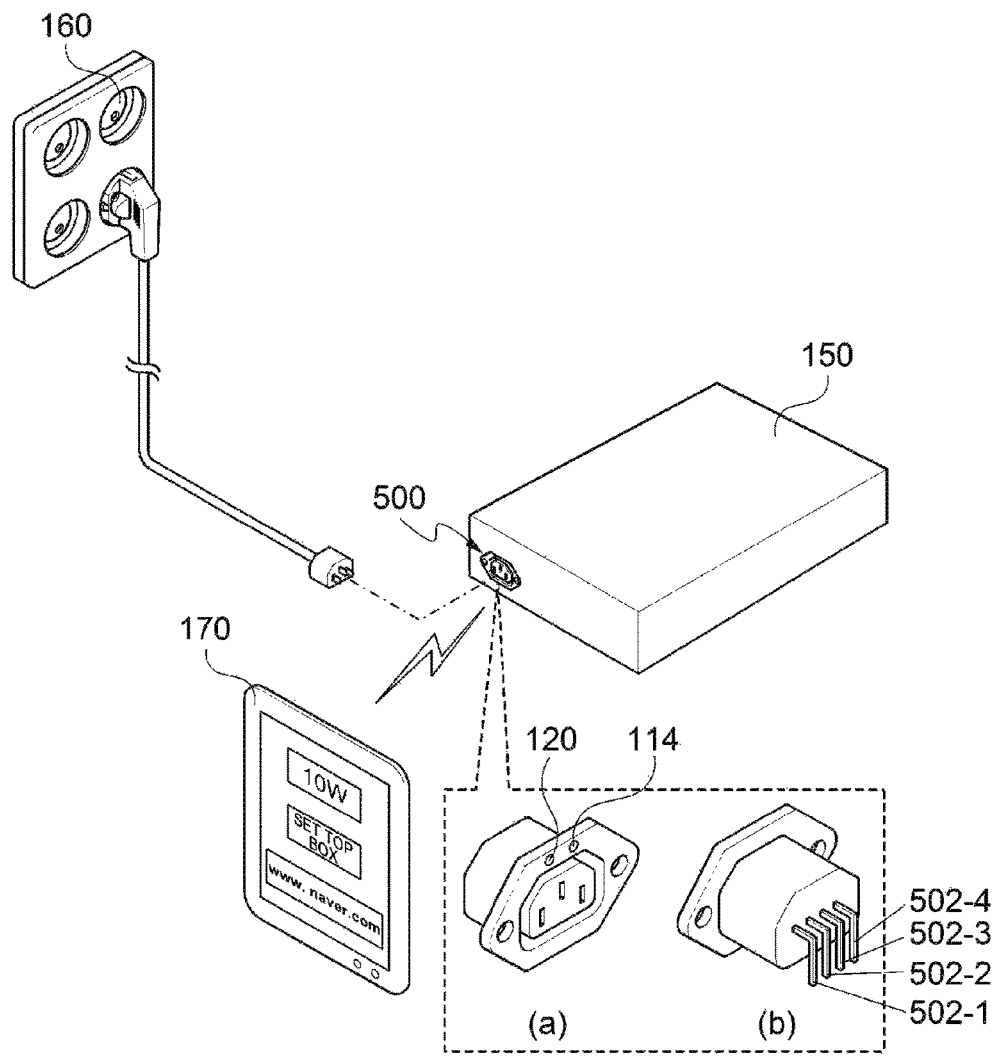
FIG. 7 is a schematic view showing an electrical socket type-operation control device for an electronic apparatus according to a fifth embodiment of the present disclosure.
Figure 8:
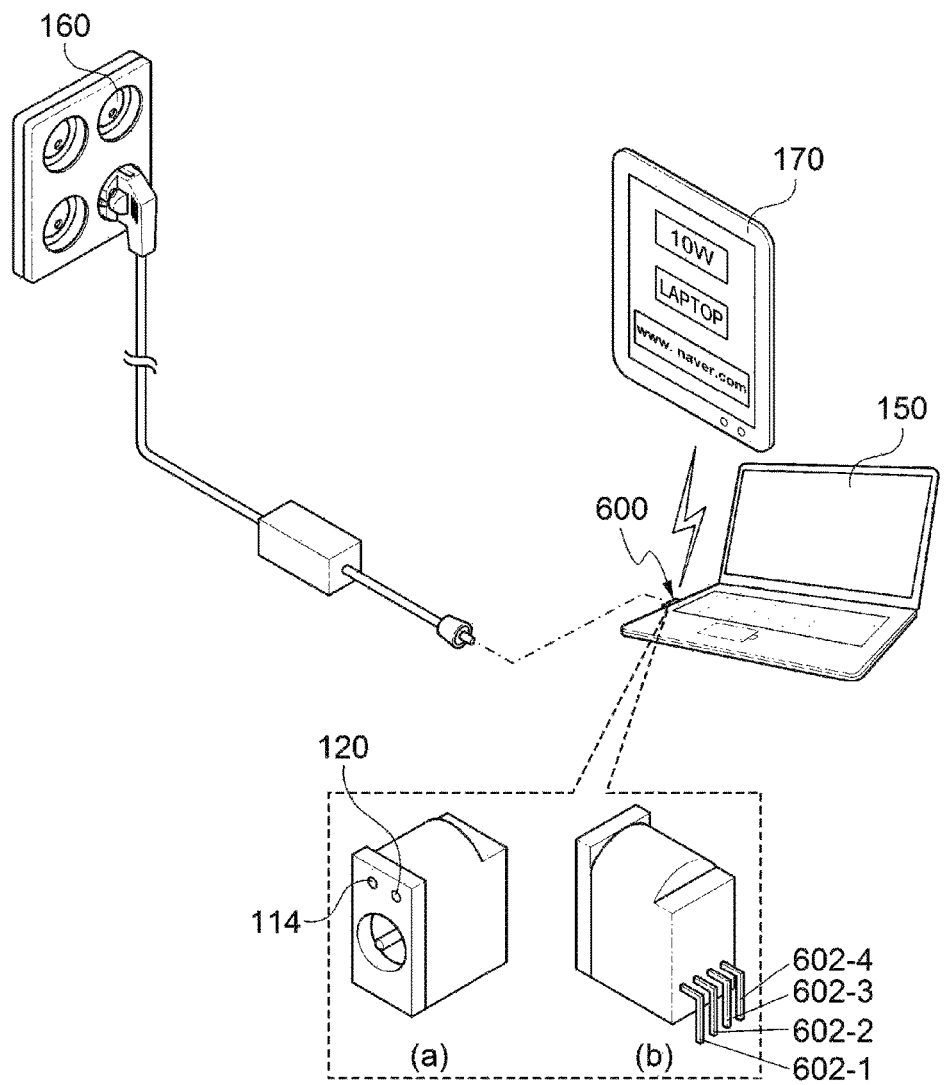
FIG. 8 is a schematic view showing an electrical socket type-operation control device for an electronic apparatus according to a sixth embodiment of the present disclosure.
Figure 9:
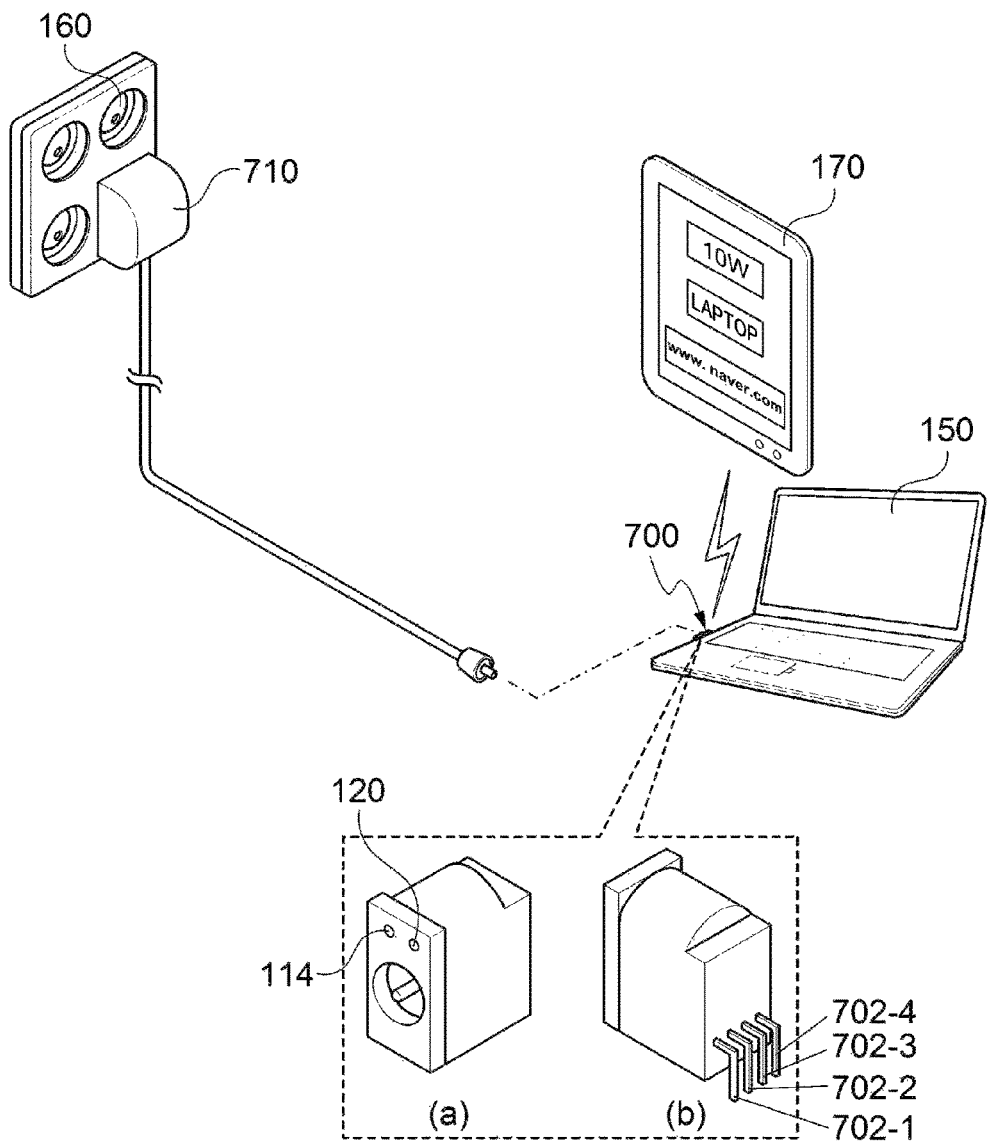
FIG. 9 is a schematic view showing an electrical socket type-operation control device for an electronic apparatus according to a seventh embodiment of the present disclosure.

FIG. 6 is a schematic view showing an operation control device 400 for an electronic apparatus according to a fourth embodiment of the present disclosure, FIG. 7 is a schematic view showing an operation control device 500 for an electronic apparatus according to a fifth embodiment of the present disclosure, FIG. 8 is a schematic view showing an operation control device 600 for an electronic apparatus according to a sixth embodiment of the present disclosure, and FIG. 9 is a schematic view showing an operation control device 700 for an electronic apparatus according to a seventh embodiment of the present disclosure. The operation control devices 400, 500, 600, and 700 according to the fourth to seventh embodiments of the present disclosure may be, for example, an electrical socket.

First, the operation control device 400 for an electronic apparatus according to the fourth embodiment of the present disclosure may be an electrical socket for AC power, and built or mounted in the electronic apparatus 150 to be connected to a power plug. The operation control device 400 for an electronic apparatus may include three holes (L, N, and FG) for connection to a cable of the power plug at an end of one side thereof, and include six pins 402-1, 402-2, 402-3, 402-4, 402-5, and 402-6 for connection to a circuit unit (for example, a PCB as the above-described CPU) within the electronic apparatus 150 at an end of the other side thereof. The circuit unit within the electronic apparatus 150 may receive power through the operation control device 400 for an electronic apparatus, or transmit and receive signals to and from the operation control device 400 for an electronic apparatus.

The AC power pins 402-1 and 402-2 may be pins for supplying AC power to the electronic apparatus 150, and perform the same function as that of the above-described AC power lines (AC_L and AC_N; 112-1 and 112-2). The first ground pin 402-3 may be a pin for grounding the AC power pins 402-1 and 402-2, and perform the same function as that of the first ground line 112-3. The reception pin 402-4 may be a pin for receiving various signals from the electronic apparatus 150, and perform the same function as that of the above-described reception line 112-4. The transmission pin 402-5 may be a pin for transmitting various signals to the electronic apparatus 150, and perform the same function as that of the above-described transmission line 112-5. The second ground pin 402-6 may be a pin for grounding the reception pin 402-4 or the transmission pin 402-5, and perform the same function as that of the above-described second ground line 112-6.

In addition, the operation control device 500 for an electronic apparatus according to the fifth embodiment of the present disclosure may be an electrical socket for AC-DC, and may be built or mounted in the electronic apparatus 150 to be connected to an AC power socket or a power plug.

A DC power pin 502-1 may be a pin for supplying DC power to the electronic apparatus 150, and perform the same function as that of the above-described DC power line 112-7. A reception pin 502-2 and a transmission pin 502-3 may be pins for transmitting and receiving signals to and from the electronic apparatus 150, and perform the same functions as those of the above-described reception line 112-8 and transmission line 112-9. A third ground pin 502-4 may be a pin for grounding the reception pin 502-2 or the transmission pin 502-3, and perform the same function as that of the above-described third ground line 112-10.

The operation control device 500 for an electronic apparatus according to the fifth embodiment of the present disclosure may include an AC-DC conversion unit (not shown) for internally converting AC power into DC power. The AC-DC conversion unit may convert the AC power supplied to the operation control device 500 for an electronic apparatus into the DC power, and adopt an analog-digital converter which is generally used.

In addition, the operation control device 600 for an electronic apparatus according to the sixth embodiment of the present disclosure may be an electrical socket for DC power, and built or mounted in the electronic apparatus 150 to be connected to a DC power socket or a power adaptor.

A DC power pin 602-1 may be a pin for supplying DC power to the electronic apparatus 150, and perform the same function as that of the above-described DC power line 112-7. A reception pin 602-2 and a transmission pin 602-3 may be pins for transmitting and receiving signals to and from the electronic apparatus 150, and perform the same functions as those of the above-described reception line 112-8 and transmission line 112-9. A third ground pin 602-4 may be a pin for grounding the reception pin 602-2 or the transmission pin 602-3, and perform the same function as that of the above-described third ground line 112-10.

In addition, the operation control device 700 for an electronic apparatus according to the seventh embodiment of the present disclosure may be another example of an electrical socket for DC power, and built or mounted in the electronic apparatus 150 to be connected to a power adaptor.

A DC power pin 702-1 may be a pin for supplying DC power to the electronic apparatus 150, and perform the same function as that of the above-described DC power line 112-7. A reception pin 702-2 and a transmission pin 702-3 may be pins for transmitting and receiving signals to and from the electronic apparatus 150, and perform the same functions as those of the above-described reception line 112-8 and transmission line 112-9. A third ground pin 702-4 may be a pin for grounding the reception pin 702-2 or the transmission pin 702-3, and perform the same function as that of the above-described third ground line 112-10. The operation control device 700 for an electronic apparatus according to the seventh embodiment of the present disclosure may be identical to the operation control device 600 for an electronic apparatus of FIG. 8, except that the adaptor is connected directly to the power supply unit 160.

Meanwhile, the operation control devices 400, 500, 600, and 700 according to the fourth to seventh embodiments of the present disclosure may perform the same functions as those of the above-described operation control devices 100, 200, and 300 for an electronic apparatus, and include the components of the operation control devices 100, 200, and 300 for an electronic apparatus shown in FIGS. 1 to 3 as is.

According to the embodiments of the present disclosure, through the operation control devices 100 to 700 for an electronic apparatus which are connected to or built or mounted in the power supply unit 160 and the electronic apparatus 150, the power supplied to the electronic apparatus 150 may be controlled, so that it is possible to achieve power saving by the interruption of communication standby power and wasted power for individual electronic apparatuses 150, and perform individual power monitoring and management. In addition, in order to use the electronic apparatus 150, the operation control devices 100 to 700 for an electronic apparatus should be necessarily inserted into the power supply unit 160 or connected to the power supply unit 160 through a power plug, an adaptor, or the like, and therefore the control of a power management object can be fully achieved.

In addition, according to the embodiments of the present disclosure, a power management circuit is not required to be additionally designed and applied within a circuit unit of a smart electronic apparatus for the purpose of power monitoring and remote management, so that it is possible to omit technology development which is added in order to enable the power management circuit to be built in the smart electronic apparatus and reduce costs required for the technology development, and shorten a replacement period of the smart electronic apparatus. This may contribute to an acceleration of the introduction of an energy management system for energy saving and peak power management, and therefore it is possible to build a power demand management system within a quick period in a simpler and cheaper way.

Further, according to the embodiments of the present disclosure, the information regarding the amount of power supplied to the electronic apparatus 150, and the identification information and state information of the electronic apparatus 150 may be transmitted to the control device 170, so that the power supply to the electronic apparatus 150 and the operation of the electronic apparatus 150 may be actively controlled according to the control signal received from the control device 170, thereby performing efficient power demand management and peak power control at lower costs, and fundamentally preventing rolling blackouts and blackouts.

In addition, according to the embodiments of the present disclosure, the diagnostic information of the electronic apparatus 150 may be transmitted to the control device 170, so that remote diagnosis of the electronic apparatus 150 for after-sales service can be made possible. The operation control device for an electronic apparatus according to the embodiments of the present disclosure can be established as an important node in the IOT (Internet Of Things) age, and can have a sufficiently large effect in terms of spreading an energy management system worldwide.

While the disclosure has been shown and described with reference to certain exemplary embodiments thereof, it will be understood by those skilled in the art that various changes in form and details may be made therein without departing from the spirit and scope of the disclosure as defined by the appended claims.

What is claimed is:

1. An operation control device for an electronic apparatus having a central processing unit (CPU), which is to be connected to the electronic apparatus and transmits and to receive signals to and from a control device for remotely controlling the power usage of the electronic apparatus and the electronic apparatus, the operation control device for the electronic apparatus comprising:
   a measuring unit that calculates an amount of power supplied to the electronic apparatus;
   a communicating unit that receives identification information of the electronic apparatus, state information of the electronic apparatus and diagnostic information of the electronic apparatus including one or more of the presence or absence of an abnormality of the electronic apparatus and a cause of the abnormality of the electronic apparatus from the electronic apparatus, transmits information regarding the amount of power, the identification information of the electronic apparatus, the state information of the electronic apparatus and the diagnostic information of the electronic apparatus to the control device, receives a first control signal for controlling the operation of the electronic apparatus from the control device, and transmits the first control signal to the electronic apparatus so that the electronic apparatus is switched into an off mode or a sleep mode, wherein the off mode and the sleep mode are a state in which the operation of the electronic apparatus is stopped while a supply of standby power to the electronic apparatus is maintained; and
   a cable that connects the communicating unit to the electronic apparatus, the cable connected to the CPU (central processing unit) of the electronic apparatus, the cable comprising:
      a plurality of AC power lines or a DC power line for supplying AC power or DC power to the electronic apparatus for using the electronic apparatus;
      a reception line for receiving the identification information of the electronic apparatus, the state information of the electronic apparatus, and the diagnostic information of the electronic apparatus from the electronic apparatus directly; and
      a transmission line for transmitting the first control signal to the electronic apparatus directly;
   wherein the reception line and the transmission line are built in the cable together with the AC power lines or the DC power line; and
   the operation control device is a power plug or an adaptor of the electronic apparatus connected directly to a power supply unit for using the electronic apparatus.

2. The operation control device for the electronic apparatus according to claim 1, further comprising
   a control unit that controls power supplied to the electronic apparatus,
   wherein the communicating unit receives a second control signal for controlling the power supplied to the electronic apparatus from the control device, and the control unit interrupts the power supplied to the electronic apparatus according to the second control signal.

3. The operation control device for the electronic apparatus according to claim 1, wherein the identification information of the electronic apparatus includes one or more of a type, a manufacturer, a date of manufacture, and a serial number of the electronic apparatus.

4. The operation control device for the electronic apparatus according to claim 1, wherein the state information of the electronic apparatus includes one or more of whether the power of the electronic apparatus is turned ON or OFF, whether the electronic apparatus is operated, a type of an operation mode that is currently operated among a predetermined plurality of operation modes of the electronic apparatus, a time at which the operation of the electronic apparatus is started or terminated, and a remaining operation time until the currently operated operation mode of the electronic apparatus is terminated.

5. The operation control device for the electronic apparatus according to claim 1, further comprising:
   a surge protector for interrupting a surge flowing through the cable.

6. The operation control device for the electronic apparatus according to claim 1, further comprising a conversion unit that converts AC power supplied to the operation control device for the electronic apparatus into DC power.

7. The operation control device for the electronic apparatus according to claim 1, wherein the communicating unit receives magnitude information of DC power to be supplied to the electronic apparatus from the control device.

8. The operation control device for the electronic apparatus according to claim 7, further comprising
a DC adjustment unit that receives the magnitude information of the DC power from the communicating unit, and adjusts a value of the DC power to be supplied to the electronic apparatus according to the magnitude information of the DC power.

9. The operation control device for the electronic apparatus according to claim 1, further comprising
a light-emitting unit that emits light having mutually different colors according to the amount of power calculated by the measuring unit or the state information of the electronic apparatus.

10. An operation control device for an electronic apparatus having a central processing unit (CPU), which is to be built in or mounted in the electronic apparatus and transmits and to receive signals to and from a control device for remotely controlling the power usage of the electronic apparatus and the electronic apparatus, the operation control device for the electronic apparatus comprising: a measuring unit that calculates an amount of power supplied to the electronic apparatus; and a communication unit that receives identification information of the electronic apparatus, state information of the electronic apparatus and diagnostic information of the electronic apparatus including one or more of the presence or absence of an abnormality of the electronic apparatus and a cause of the abnormality of the electronic apparatus from the electronic apparatus, transmits information regarding the amount of power, the identification information of the electronic apparatus, the state information of the electronic apparatus and the diagnostic information of the electronic apparatus to the control device, receives a first control signal for controlling the operation of the electronic apparatus from the control device, and transmits the first control signal to the electronic apparatus so that the electronic apparatus is switched into an off mode or a sleep mode wherein the off mode and the sleep mode are a state in which the operation of the electronic apparatus is stopped while a supply of standby power to the electronic apparatus is maintained, and a plurality of pins that connect the communication unit to the electronic apparatus, the plurality of pins connected to the CPU of the electronic apparatus, the plurality of pins comprising: a plurality of AC power pins or a DC power pin for supplying AC power or DC power to the electronic apparatus for using the electronic apparatus, a reception pin for receiving the identification information of the electronic apparatus, the state information of the electronic apparatus, and the diagnostic information of the electronic apparatus from the electronic apparatus directly, a transmission pin for transmissions the first control signal to the electronic apparatus directly, wherein the reception pin and the transmission pin are built in the electrical socket together with the AC power pins or the DC power pin; and wherein the operation control device is an electrical socket connected to a power plug or an adaptor of the electronic apparatus, and the power plug and the adaptor of the electronic apparatus are connected directly to a power supply unit for using the electronic apparatus.

11. The operation control device for the electronic apparatus according to claim 10, further comprising
a control unit that controls power supplied to the electronic apparatus,
wherein the communicating unit receives a second control signal for controlling the power supplied to the electronic apparatus from the control device, and the control unit interrupts the power supplied to the electronic apparatus according to the second control signal.

12. The operation control device for the electronic apparatus according to claim 10, wherein the identification information of the electronic apparatus includes one or more of a type, a manufacturer, a date of manufacture, and a serial number of the electronic apparatus.

13. The operation control device for the electronic apparatus according to claim 10, wherein the state information of the electronic apparatus includes one or more of whether the power of the electronic apparatus is turned ON or OFF, whether the electronic apparatus is operated, a type of an operation mode that is currently operated among a predetermined plurality of operation modes of the electronic apparatus, a time at which the operation of the electronic apparatus is started or terminated, and a remaining operation time until the currently operated operation mode of the electronic apparatus is terminated.

14. The operation control device for the electronic apparatus according to claim 10, further comprising a surge protector for interrupting a surge flowing through the plurality of pins.

15. The operation control device for the electronic apparatus according to claim 10, further comprising:
a conversion unit that converts AC power supplied to the operation control device for the electronic apparatus into DC power.

16. The operation control device for the electronic apparatus according to claim 10, wherein the communicating unit receives magnitude information of DC power to be supplied to the electronic apparatus from the control device.

17. The operation control device for the electronic apparatus according to claim 16, further comprising:
a DC adjustment unit that receives the magnitude information of the DC power from the communicating unit, and adjusts a value of the DC power to be supplied to the electronic apparatus according to the magnitude information of the DC power.

18. The operation control device for the electronic apparatus according to claim 10, further comprising:
a light-emitting unit that emits light having mutually different colors according to the amount of power calculated by the measuring unit or the state information of the electronic apparatus.

* * * * *